(12) United States Patent
Sawashi

(10) Patent No.: US 6,653,897 B2
(45) Date of Patent: Nov. 25, 2003

(54) POWER AMPLIFIER APPARATUS

(75) Inventor: Tokihiko Sawashi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/198,539

(22) Filed: Jul. 18, 2002

(65) Prior Publication Data

US 2003/0020539 A1 Jan. 30, 2003

(30) Foreign Application Priority Data

Jul. 27, 2001 (JP) ........................... P2001-227659

(51) Int. Cl.$^7$ ............................................. H03F 3/217

(52) U.S. Cl. ........................................ 330/10; 330/197

(58) Field of Search .................... 330/10, 207, 251, 330/197, 302, 305, 306

(56) References Cited

U.S. PATENT DOCUMENTS 4,447,791 A * 5/1984 Noro et al. .................. 330/297
5,115,205 A * 5/1992 Holmes, Jr. .................. 330/10
5,973,569 A * 10/1999 Nguyen ....................... 330/298

* cited by examiner

*Primary Examiner*—Timothy P. Callahan
*Assistant Examiner*—Linh M Nguyen
(74) *Attorney, Agent, or Firm*—Jay H. Maioli

(57) ABSTRACT

A power amplifier apparatus includes a pair of power amplifiers for performing switching-type power amplification, a transformer, and a capacitor. The transformer is formed of a pair of coils that are connected in series between the corresponding output terminals of the pair of power amplifiers and the corresponding terminals of a speaker. The capacitor is connected in parallel with the output terminals of the pair of coils. With this configuration, a mutual inductance and a leakage inductance are generated in the coils. As a result, 180° out-of-phase and in-phase noise components contained in an output of the power amplifier apparatus can be eliminated.

3 Claims, 4 Drawing Sheets

POWER AMPLIFIER APPARATUS

BACKGROUND OF THE INVENTION

1. Field of the Invention

The present invention relates to a power amplifier apparatus.

2. Description of the Related Art

In some audio power amplifier apparatuses, power amplification is performed by switching. Such a switching-type power amplifier apparatus is configured, for example, as shown in FIG. 1.

In FIG. 1, a broadcast wave, such as a frequency modulation (FM) broadcast wave, is received by an antenna 11 and is supplied to a receiving circuit 12 where an analog audio signal of a target broadcast is extracted. The analog audio signal is then supplied to a switching-type power amplifier apparatus 20.

In the power amplifier apparatus 20, the audio signal output from the receiving circuit 12 is supplied to a converter circuit 21, where it is converted into a digital audio signal. Simultaneously, the digital audio signal is converted into a pulse modulation signal, for example, a pulse width modulation (PWM) signal P21, in which the integrated value of one sample is equivalent to the level of the original analog audio signal. The carrier frequency of the PWM signal P21 is, in general, from a few hundred of kilohertz to a few megahertz.

The PWM signal P21 is then supplied to a drive amplifier 22 where it is amplified to a pair of PWM signals +P22 and −P22 which are 180° out of phase with each other, and the PWM signals +P22 and −P22 are supplied to power amplifiers 23A and 23B, respectively. The power amplifiers 23A and 23B are class D amplifiers, and the PWM signals +P22 and −P22 switch a predetermined DC voltage, thereby amplifying the power of the PWM signals +P22 and −P22.

The output terminals of the power amplifiers 23A and 23B are connected to the corresponding ends of a speaker 14 via coils 24A and 24B, respectively, and a filter 25, which is described below. In this case, a capacitor 24C is connected to the output terminals of the coils 24A and 24B. With this configuration, the coils 24A and 24B, and the capacitor 24C form a low-pass filter 24.

Accordingly, the power amplifiers 23A and 23B operate as a single balanced-transformerless (BTL)-type amplifier with respect to the speaker 14. Then, amplified PWM signals +P23 and −P23 are output from the power amplifiers 23A and 23B, respectively, and are integrated by the low-pass filter 24 into the original analog audio signal. The analog audio signal is then supplied to the speaker 14 via the filter 25, which is formed of, for example, a choke coil.

According to the above-configured switching-type power amplifier apparatus 20, the power amplifiers 23A and 23B perform power amplification by turning on or off the voltage and the current in accordance with the PWM signals +P22 and −P22, thereby obtaining a high-power output with high efficiency.

The PWM signals +P23 and −P23 are pulses obtained by PWM-modulating the audio signal. Accordingly, the presence of many spectra can be observed, as shown in FIG. 2, at the frequency positions of the fundamental wave and the higher harmonics, and the spectral components are distributed over a wide frequency range from a few hundred kilohertz to a few hundred megahertz. In the example shown in FIG. 2, the carrier frequency of the PWM signals +P23 and −P23 is 240 kHz. Additionally, the PWM signals +P23 and −P23 are amplified by the power amplifiers 23A and 23B, respectively.

As a result, part of the higher-harmonic components of the PWM signals +P23 and −P23 interferes with the reception of amplitude modulation (AM) broadcasts, FM broadcasts, or television broadcasts, and in some cases, a broadcast of a desired frequency cannot be received. Such higher-harmonic components may adversely influence peripheral electronic circuits or devices.

Accordingly, the low-pass filter 24 is provided for eliminating the interfering noise components (higher-harmonic components). That is, among the noise components contained in the PWM signals +23P and −23P, noise components which are 180° out of phase with each other (normal mode noise) cancel each other out.

However, the noise components contained in the PWM signals +P23 and −P23 also include in-phase noise components (common mode noise), which cannot be canceled out in the low-pass filter 24, and are disadvantageously output from the low-pass filter 24. Thus, the filter 25 is provided for the power amplifier apparatus 20 shown in FIG. 1 for eliminating the common mode noise.

Accordingly, in this power amplifier apparatus 20, two filters, such as the filters 24 and 25, are required for eliminating the 180°-out-of-phase noise components and the in-phase noise components, thereby increasing the cost.

SUMMARY OF THE INVENTION

Accordingly, it is an object of the present invention to solve the above-described problem.

In order to achieve the above object, the present invention provides a power amplifier apparatus including:

a pair of power amplifiers, which form a BTL-type amplifier, for performing switching-type power amplification; a transformer including a pair of coils connected in series between the output terminals of the pair of power amplifiers and the corresponding ends of a speaker; and a capacitor connected in parallel with the output terminals of the pair of coils. The pair of coils include a mutual inductance and a leakage inductance.

With this configuration, the 180°-out-of-phase and in-phase noise components contained in the output of the BTL-type power amplifier can be eliminated by the mutual inductance and the leakage inductance simply by using one transformer and one capacitor. This is effective for space saving, and the cost can be reduced. The number of assembly steps can also be decreased.

DESCRIPTION OF THE PREFERRED EMBODIMENTS

Figure 3:
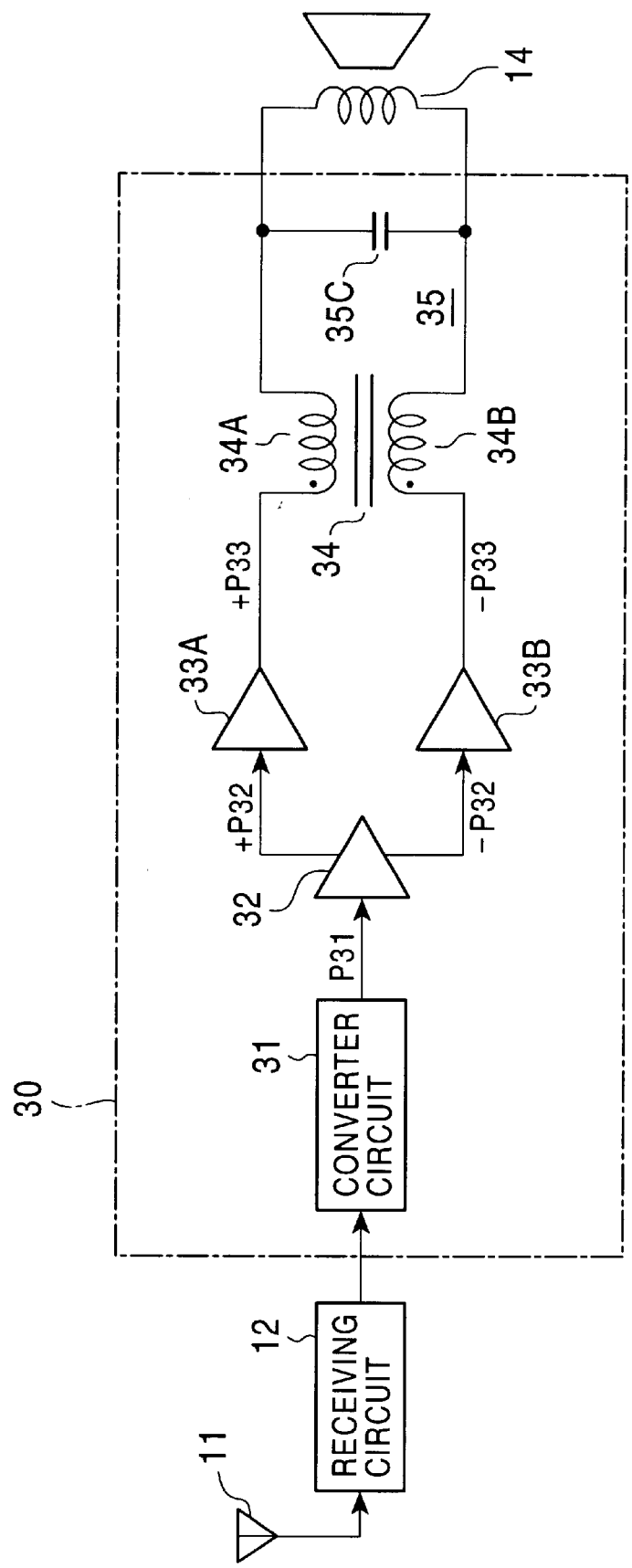
FIG. 3 is a connection diagram illustrating a power amplifier apparatus according to an embodiment of the present invention.

FIG. 3 illustrates a switching-type power amplifier apparatus 30 according to an embodiment of the present invention. In this power amplifier apparatus 30, an audio signal from the receiving circuit 12 is supplied to the converter circuit 31, where it is converted into a digital audio signal. Simultaneously, the digital audio signal is also converted into a pulse modulation signal, for example, a PWM signal P31, in which the integrated value of one sample is equivalent to the level of the original analog audio signal. The carrier frequency of the PWM signal P31 is, in general, from a few hundred of kilohertz to a few megahertz.

The PWM signal P31 is then supplied to a drive amplifier 32 where it is amplified to a pair of PWM signals +P32 and −P32 which are 180° out of phase with each other, and the PWM signals +P32 and −P32 are supplied to power amplifiers 33A and 33B, respectively. The power amplifiers 33A and 33B, which form a single BTL amplifier, are class D amplifiers, and the PWM signals +P32 and −P32 switch a predetermined DC voltage, thereby amplifying the power of the PWM signals +P32 and −P32.

The output terminals of the amplifiers 33A and 33B are connected to the corresponding ends of the speaker 14 via coils 34A and 34B, respectively. In this case, the coils 34A and 34B are wound around, for example, a common magnetic core so as to form a transformer 34, and a mutual inductance of a predetermined magnitude is generated between the coils 34A and 34B.

A leakage inductance of a predetermined magnitude is also generated between the coils 34A and 34B. The number of turns of the coils 34A and 34B is set to be the same, and the winding direction (polarity) of the coils 34A and 34B is also the same as viewed from the amplifiers 33A and 33B.

A capacitor 35C is connected in parallel with the output terminals of the coils 34A and 34B. With this arrangement, the coils 34A and 34B, and the capacitor 35C form a low-pass filter 35.

With this configuration, the power amplifiers 33A and 33B operate as a-single BTL-type amplifier with respect to the speaker 14. The PWM signals +P33 and −P33 output from the power amplifiers 33A and 33B are supplied to the speaker 14 via the coils 34A and 34B, respectively.

When the 180°-out-of-phase components are output from the amplifiers 33A and 33B, they flow in the coils 34A and 34B in opposite directions. Since the coils 34A and 34B form the transformer 34, the self-inductances of the coils 34A and 34B cancel each other out.

Figure 1:
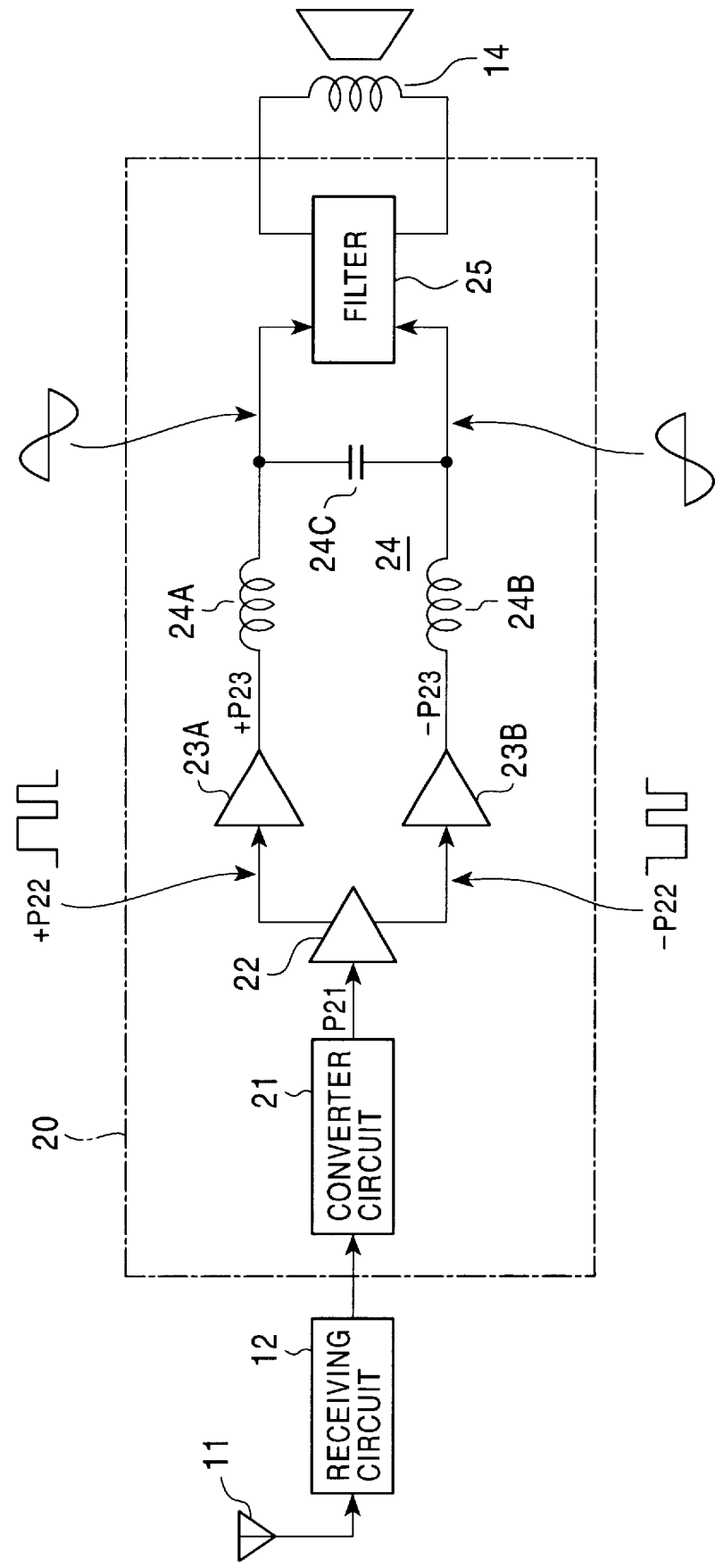
FIG. 1 is a connection diagram illustrating a known power amplifier apparatus.
Figure 2:
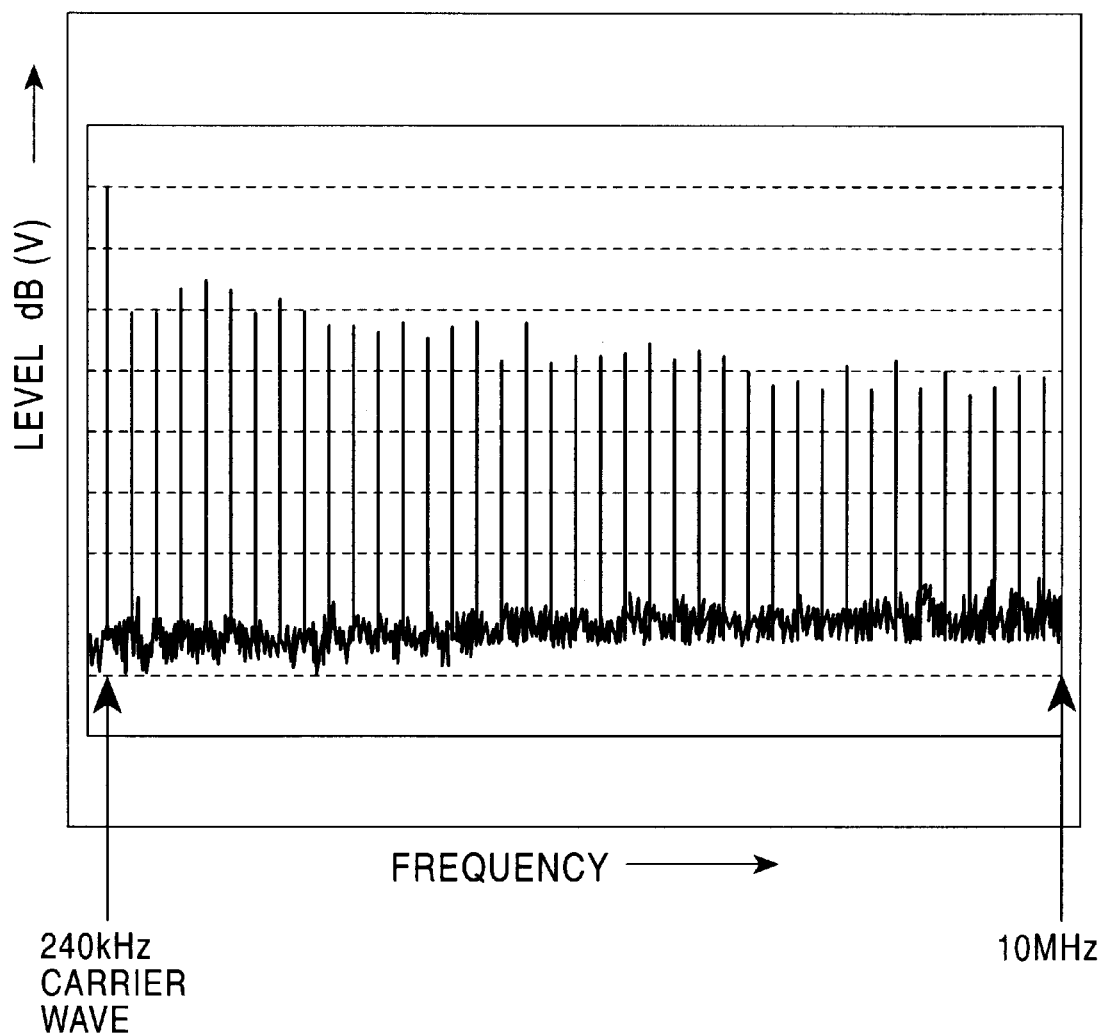
FIG. 2 is a diagram illustrating signal spectra in a known power amplifier apparatus.

However, a leakage inductance is generated between the coils 34A and 34B, in which case, it acts as a self-inductance of the coils 24A and 24B in the example shown in FIG. 1. Accordingly, the coils 34A and 34B, and the capacitor 35C serve as the low-pass filter 35 for the 180°-out-of-phase components output from the amplifiers 33A and 33B.

Accordingly, the PWM signals +P33 and −P33 output from the amplifiers 33A and 33B, respectively, are integrated by the low-pass filter 35 into the original analog audio signal, and the analog audio signal is then supplied to the speaker 14. Among the higher-harmonic components output from the amplifiers 33A and 33B, the 180°-out-of-phase noise components, which would otherwise be output from the low-pass filter 35, are instead canceled out in the low-pass filter 35.

When the in-phase components are output from the amplifiers 33A and 33B, they flow in the coils 34A and 34B in the same direction, and are canceled out by the coils 34A and 34B, since the coils 34A and 34B are coupled by a self-inductance. Accordingly, among the higher-harmonic components output from the amplifiers 33A and 33B, the in-phase noise components, which would otherwise be output from the transformer 34, are instead canceled out in the coils 34A and 34B.

Figure 4:
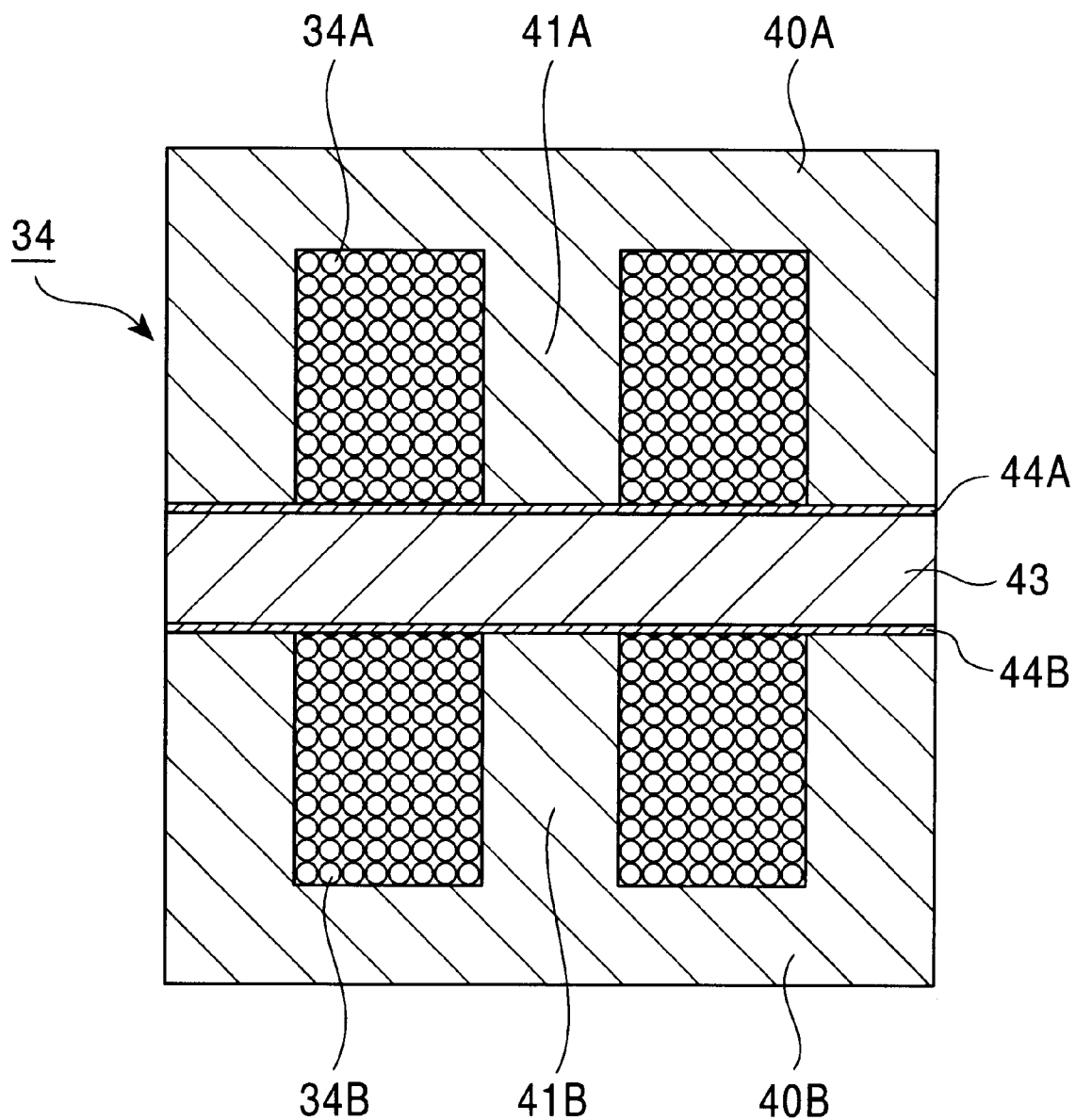
FIG. 4 is a sectional view illustrating a separated-type transformer used in the present invention.

In this embodiment, in order to obtain a leakage inductance of a predetermined magnitude, a separated-type transformer, such as that shown in FIG. 4, is used as the transformer 34. In this configuration, a pair of E-shaped magnetic members 40A and 40B are placed such that they face each other, and the coils 34A and 34B, each of which is separated, are wound around discontinuous center magnetic members (center cores) 41A and 41B. A planar magnetic member 43 obtained by attaching plastic sheets 44A and 44B onto the top and bottom portions of the magnetic member 43 is placed between the pair of E-shaped magnetic members 40A and 40B. Then, the pair of E-shaped magnetic members 40A and 40B and the planar magnetic member 43 are bonded by using, for example, wax. In this separated-type transformer 34 shown in FIG. 4, when the speaker 14 was 4 Ω and the capacitor 35C was 10 μF, the mutual inductance was 21 to 23 μH, and the leakage inductance was 8 to 10 μH.

According to the above-described power amplifier apparatus 30, the 180°-out-of-phase and in-phase noise components output from the power amplifiers 33A and 33B can be eliminated simply by using the transformer 34 and the capacitor 35C, unlike the power amplifier apparatus 20 shown in FIG. 1, which requires the two filters 24 and 25. Accordingly, the above-described configuration of this embodiment is very effective for a space-saving apparatus. As a result, the cost can be decreased.

Additionally, in this configuration, it is only necessary that one transformer 34 and one capacitor 35C be mounted for each channel. Accordingly, the number of assembly steps is decreased compared to the power amplifier apparatus 20 shown in FIG. 1 in which the coils 24A and 24B, capacitor 24C, and the filter 25 should be mounted, and thus, it is very effective also in terms of the productivity. As a result, the cost can be reduced. This is very effective for, in particular, multi-channel stereo power amplifiers.

What is claimed is:

1. A power amplifier apparatus comprising:
    a pair of power amplifiers connected to form a balanced-transformerless-type amplifier for performing switching-type power amplification;
    a transformer including a pair of coils connected in series between output terminals of said pair of power amplifiers and corresponding input terminals of a speaker; and
    a capacitor connected in parallel with output terminals of said pair of coils,
    wherein said pair of coils include a mutual inductance and a leakage inductance for altering signals fed through said pair of coils.

2. The power amplifier apparatus according to claim 1, further comprising a drive amplifier for supplying pulse modulation signals to said pair of power amplifiers, wherein the pulse modulation signals are out of phase with each other by 180 degrees and an integrated value of the pulse modulation signals corresponds to a level of an original analog audio signal fed to said pair of power amplifiers.

3. The power amplifier apparatus according to claim 1, wherein said transformer comprises a separated-type transformer in which said pair of coils are wound around corresponding independent cores.

* * * * *